(12) United States Patent
Hashimoto et al.

(10) Patent No.: US 8,263,424 B2
(45) Date of Patent: Sep. 11, 2012

(54) OPTO-ELECTRONIC AND ELECTRONIC DEVICES USING AN N-FACE OR M-PLANE GALLIUM NITRIDE SUBSTRATE PREPARED VIA AMMONOTHERMAL GROWTH

(75) Inventors: Tadao Hashimoto, Santa Barbara, CA (US); Hitoshi Sato, Santa Barbara, CA (US); Shuji Nakamura, Santa Barbara, CA (US)

(73) Assignees: The Regents of the University of California, Oakland, CA (US); Japan Science and Technology Agency, Saitama Prefecture (JP)

( * ) Notice: Subject to any disclaimer, the term of this patent is extended or adjusted under 35 U.S.C. 154(b) by 169 days.

(21) Appl. No.: 12/792,615

(22) Filed: Jun. 2, 2010

(65) Prior Publication Data
US 2010/0275837 A1 Nov. 4, 2010

Related U.S. Application Data

(63) Continuation of application No. 11/765,629, filed on Jun. 20, 2007, now Pat. No. 7,755,172.

(60) Provisional application No. 60/815,507, filed on Jun. 21, 2006.

(51) Int. Cl.
| | |
|---|---|
| H01L 21/00 | (2006.01) |
| C30B 23/00 | (2006.01) |
| C30B 25/00 | (2006.01) |
| C30B 28/12 | (2006.01) |
| C30B 28/14 | (2006.01) |

(52) U.S. Cl. ............. 438/46; 438/47; 117/88; 117/101; 117/216; 257/E21.09; 257/E29.089; 257/E33.03

(58) Field of Classification Search ................ 438/46, 438/47; 117/216, 88, 101; 257/E21.09, E29.089, 257/E33.03

See application file for complete search history.

(56) References Cited

U.S. PATENT DOCUMENTS

| | | | |
|---|---|---|---|
| 6,398,867 | B1 | 6/2002 | D'Evelyn et al. |
| 7,078,731 | B2 | 7/2006 | D'Evelyn et al. |
| 2004/0051105 | A1 | 3/2004 | Tsuda et al. |
| 2004/0245535 | A1 | 12/2004 | D3 Evelyn et al. |
| 2005/0098095 | A1 | 5/2005 | D'Evelyn et al. |
| 2005/0224783 | A1 | 10/2005 | Matsuyama et al. |
| 2006/0057749 | A1 | 3/2006 | Dwilinski et al. |
| 2006/0118799 | A1 | 6/2006 | D'Evelyn et al. |
| 2006/0255341 | A1 | 11/2006 | Pinnington et al. |

FOREIGN PATENT DOCUMENTS

| | | |
|---|---|---|
| FR | 2796657 | 1/2001 |
| WO | WO 03035945 | 5/2003 |
| WO | WO2004003261 | 1/2004 |

OTHER PUBLICATIONS

EP Search Report dated Jun. 22, 2010 (EP Application No. 07809717.7).

(Continued)

*Primary Examiner* — David S Blum
(74) *Attorney, Agent, or Firm* — Gates & Cooper LLP (57) ABSTRACT

A method for growing III-V nitride films having an N-face or M-plane using an ammonothermal growth technique. The method comprises using an autoclave, heating the autoclave, and introducing ammonia into the autoclave to produce smooth N-face or M-plane Gallium Nitride films and bulk GaN.

40 Claims, 10 Drawing Sheets

OTHER PUBLICATIONS

Dimitrov R., et al., "Two-dimensional electron gases in Ga-face and N-face AlGaN/GaN heterostructures grown by plasma-induced molecular beam epitaxy and metalorganic chemical vapor deposition on sapphire", Journal of Applied Physics, 2000 American Institute of Physics. New York, US LNKD-DOI:10/1063/1.372353, vol. 87, No. 7, Apr. 1, 2000, pp. 3375-3380, XP012049755 ISSN: 0021-8979.

Callahan, M. et al., "Growth of GaN crystals under ammonothermal conditions," Materials Research Society 798 (2004): Y2.10.1-Y2.10. 6.

Rajan, S. et al., "Growth and electrical characterization of n-face AlGaN/GaN heterostructures," Japanese Journal of Applied Physics, vol. 44, No. 49, 2005, pp. L1478-L1480.

Ramachandran, V. et al., "Inversion of wurtzite GaN(0001) by exposure to magnesium" Applied Physics Letters, vol. 75, No. 6, Aug. 9, 1999, pp. 808-810.

OPTO-ELECTRONIC AND ELECTRONIC DEVICES USING AN N-FACE OR M-PLANE GALLIUM NITRIDE SUBSTRATE PREPARED VIA AMMONOTHERMAL GROWTH

CROSS-REFERENCE TO RELATED APPLICATIONS

This application is a continuation under 35 U.S.C Section 120 of U.S. Utility application Ser. No. 11/765,629, filed on Jun. 20, 2007, by Tadao Hashimoto, Hitoshi Sato, and Shuji Nakamura, entitled "OPTO-ELECTRONIC AND ELECTRONIC DEVICES USING N-FACE OR M-PLANE GaN SUBSTRATE PREPARED WITH AMMONOTHERMAL GROWTH," now U.S. Pat. No. 7,755,172, issued Jul. 13, 2010, which application claims the benefit under 35 U.S.C Section 119(e) of U.S. Provisional Application Ser. No. 60/815,507, filed on Jun. 21, 2006, by Tadao Hashimoto, Hitoshi Sato, and Shuji Nakamura, entitled "OPTO-ELECTRONIC AND ELECTRONIC DEVICES USING N-FACE GaN SUBSTRATE PREPARED WITH AMMONOTHERMAL GROWTH," both of which applications are incorporated by reference herein.

The present application is related to the following application:

U.S. Provisional Patent Application Ser. No. 60/790,310, filed Apr. 7, 2006, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," by Tadao Hashimoto, et al.;

which application is incorporated by reference herein.

BACKGROUND OF THE INVENTION

1. Field of the Invention

The invention is related to a method and materials for growing N-face Gallium Nitride (GaN) or M-plane Gallium Nitride using ammonothermal growth techniques.

2. Description of the Related Art

The usefulness of gallium nitride (GaN) and its ternary and quaternary alloys incorporating aluminum and indium (AlGaN, InGaN, AlINGaN) has been well established for fabrication of visible and ultraviolet opto-electronic devices and high-power electronic devices. These devices are typically grown epitaxially on heterogeneous substrates, such as sapphire and silicon carbide, by Vapor Phase Epitaxy (VPE) techniques such as Metal-Organic Chemical Vapor Deposition (MOCVD) and Molecular Beam Epitaxy (MBE). The growth of device layers is usually initiated by growing a buffer layer on the substrate in the MOCVD or MBE reactor. The buffer layer provides a smooth surface of GaN or AlN suitable for successive growth of device layers. However, the buffer layer is usually a Ga-polar (Ga-face) surface, because growth along the N-polar (N-face) direction results in a rough surface in the VPE growth phase.

Commercially available GaN-based devices are all grown on Ga-polar surface (Gallium-face of the C-plane, also known as the (0001) plane). Recently, however, several studies have pointed out many benefits of N-polar (the Nitrogen-face of the C-plane, also known as the (000-1) plane) devices. Also, it has been pointed out that devices grown on M-plane, also known as the {10-10} plane have further advantages over Ga-polar or N-polar devices.

One major benefit of N-polar (N-face) growth is for p-type doping. In Ga-polar (Ga-face) growth of Mg-doped GaN, the film polarity locally starts to invert to the N-polar (N-face) direction. This phenomenon is known as inversion domains when the concentration of Mg exceeds a certain limit. The inversion domains deteriorate the surface smoothness; therefore, a Ga-polar (Ga-face) film is limited in its hole concentrations. Since high Mg doping favors N-polar (N-face) growth, using a N-polar (N-face) substrate is expected to attain higher Mg concentrations, and thus higher hole concentrations. Opto-electronic devices with high p-type conduction will improve their efficiency by decreasing series resistance of the devices.

A second major benefit is the inverted polarization charge. Although GaN-based High Electron Mobility Transistors (HEMTs) are currently available, their usage is very limited due to many unsolved problems. GaN-based HEMTs currently available have high gate leakage and are typically depletion mode devices. Transistors grown on N-face GaN would realize low gate leakage devices, devices that operate in enhancement mode (normally off mode), are crucial for power switching devices, low dispersion devices, and improved carrier confinement.

One of the major benefits of M-plane optical devices is the higher emission efficiency due to absence of polarization field. Another major benefit of M-plane optical devices is that the optically active layer can contain more In, allowing longer wavelength emission. This enables to realize green, yellow, even red color LEDs.

Despite these benefits, current technology is limited to Ga-polar (Ga-face) devices because of the poor surface smoothness of N-polar (N-face) surface or M-plane surface. Therefore new technology to attain a smooth surface of N-polar (N-face) or M-plane GaN is needed to realize the next generation of high-performance devices such as ultra-high bright LEDs, low threshold current Laser Diodes (LDs), high-power high-speed signal transistors and high-power switching transistors.

SUMMARY OF THE INVENTION

To overcome the limitations in the prior art described above, and to overcome other limitations that will become apparent upon reading and understanding the present specification, the present invention discloses a method for growing N-face or M-plane GaN using an ammonothermal growth technique.

In summary, the present invention describes methods and devices which have a directly grown N-face of the C-plane (000-1) or M-plane {10-10}. Although described with respect to GaN herein, any group-III nitride material can benefit from the teachings of the present invention.

An electronic device in accordance with the present invention comprises a GaN layer, wherein the GaN layer is fabricated by utilizing an N-polar (000-1) surface or M-plane {10-10} surface of the GaN layer having an off-axis angle less than 10 degrees, wherein the N-polar (000-1) surface or the M-plane {10-10} surface is prepared with an ammonothermal growth technique.

Such a device further optionally comprises the GaN being fabricated under pressure less than 760 Torr, and an AlGaN layer coupled to the N-polar or M-plane surface of the GaN layer, and a second GaN layer coupled to the AlGaN layer, wherein electrons are induced at the interface between the AlGaN layer and the second GaN layer on the second GaN layer side.

An opto-electronic device in accordance with the present invention comprises an electrically conducting GaN substrate having an N-polar or M-plane surface whose off-axis angle is less than ten degrees, the GaN substrate being fabricated using an ammonothermal growth method, a plurality of n-type group III nitride layers coupled to the N-polar or M-plane surface of the GaN substrate, at least one group III nitride light-emitting active layer coupled to the plurality of n-type group III nitride layers, and at least one p-type group III nitride layer having an Mg doping coupled to the active layers.

Such a device further optionally comprises at least one Mg-doped layer, wherein a concentration of the Mg-doped layer is more than $10^{21}$ cm$^{-3}$, and a thickness of the Mg-doped layer is more than 0.1 micron.

A method for directly growing N-polar (000-1) or M-plane {10-10} Gallium Nitride (GaN) in accordance with the present invention comprises placing a seed crystal of GaN having an exposed N-face (000-1) or M-plane {10-10} of GaN into an autoclave, placing a mineralizer into the autoclave, placing a source into the autoclave, adding ammonia to the autoclave, and heating the autoclave.

Such a method further optionally comprises the mineralizer being selected from a group comprising NaNH$_2$, KNH$_2$, LiNH$_2$, NH$_4$Cl, NH$_4$Br, and NH$_4$I, the source comprising Ga metal, the autoclave being heated in zones, a first zone being heated to a first temperature and a second zone being heated to a second temperature, and the source being placed in the first zone and the seed crystal of GaN having an exposed N-face (000-1) or M-plane {10-10} of GaN being placed in the second zone.

A group-III nitride layer in accordance with the present invention comprises a group-III nitride layer grown on a substrate, wherein the group-III nitride layer comprises an N-face of a C-plane (000-1) or a M-plane {10-10} that is directly exposed as a result of the growth of the group-III nitride layer.

Such a layer further optionally comprises the growth being an ammonothermal growth, the N-face of the C-plane (000-1) or the M-plane {10-10} is substantially co-planar with a surface of the substrate, the N-face of the C-plane (000-1) or the M-plane {10-10} is tilted with respect to a surface of the substrate, the N-face of the C-plane (000-1) or the M-plane {10-10} is tilted at an angle less than 10 degrees with respect to the surface of the substrate, the N-face of the C-plane (000-1) or the M-plane {10-10} directly accepts growth of at least one additional group-III nitride layer, the at least one additional group-III nitride layer comprising at least one Mg-doped layer wherein a concentration of the Mg-doped layer is more than $10^{21}$ cm$^{-3}$, and a thickness of the Mg-doped layer being more than 0.1 micron.

The current invention provides opto-electronic devices such as Light Emitting Diodes (LEDs) and Laser Diodes (LDs), and electronic devices such as High-Electron Mobility Transistors (HEMTs), Field Effect Transistors (FETs) and Hetero-Bipolar Transistors (HBTs) with higher performance than existing devices by utilizing an N-face or M-plane GaN substrate prepared with an ammonothermal growth method. All commercially available GaN-related devices are fabricated on the Ga-face of GaN substrates at this moment, although utilizing the N-face or M-plane of GaN substrates would provide better performance. This is because growth of GaN template on a heterogeneous substrate such as sapphire or SiC favors Ga-face growth, and N-face or M-plane growth usually suffers from a rough surface profile, making processing and further growth more difficult. By using an ammonothermal growth method, N-face or M-plane growth results in a smoother surface than Ga-face growth. Utilizing such a smooth surface of an N-polar (N-face) or M-plane substrate will enable to improve performance of various opto-electronic and electronic devices made of GaN and its related alloys.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Crystallography

Figure 1A:
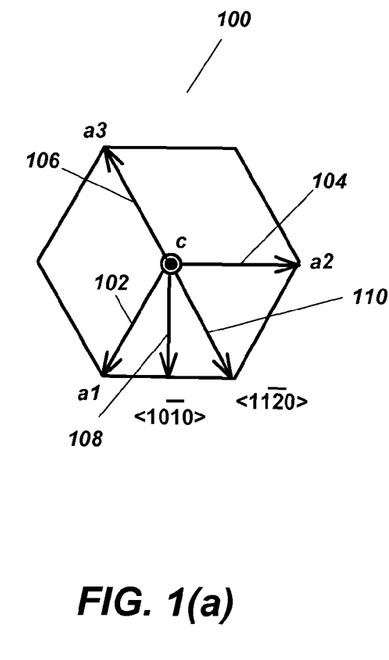
FIGS. 1(a) and 1(b) are schematics of crystallographic directions and planes of interest in hexagonal GaN.
Figure 1B:
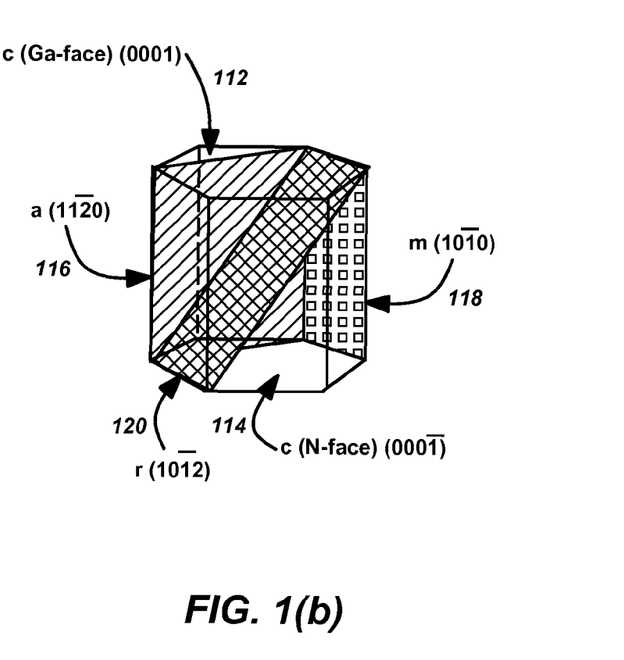

FIGS. 1(a) and 1(b) are schematics of crystallographic directions and planes of interest in hexagonal GaN. These schematics show the different crystallographic growth directions and also the planes of interest in the hexagonal wurtzite GaN structure. The fill patterns are intended to illustrate the planes of interest, but do not represent the materials of the structure.

FIG. 1(a) shows a top view of c-plane 100, with directions a1 102, a2 104, and a3 106 to orient the wurtzite crystal. Directions 108 and 110 also assist in orienting the crystal, showing the <10-10> and <11-20> directions, respectively.

FIG. 1(b) illustrates an isometric view of the wurtzite crystal. The c-plane, Ga-face (0001) of the crystal is shown as plane 112. The c-plane, N-face (000-1) of the crystal is shown as plane 114. The a-plane 116, m-plane 118, and r-plane 120 are shown for clarity.

It is relatively easy to grow c-plane (Ga-face, (0001)) GaN due to its large growth window (pressure, temperature and precursor flows) and its stability. Therefore, nearly all GaN-based devices are grown along the polar c-axis. However, as a result of c-plane growth, each material layer suffers from separation of electrons and holes to opposite faces of the layers. Furthermore, strain at the interfaces between adjacent layers gives rise to piezoelectric polarization, causing further charge separation.

Growth Chamber

Figure 2:
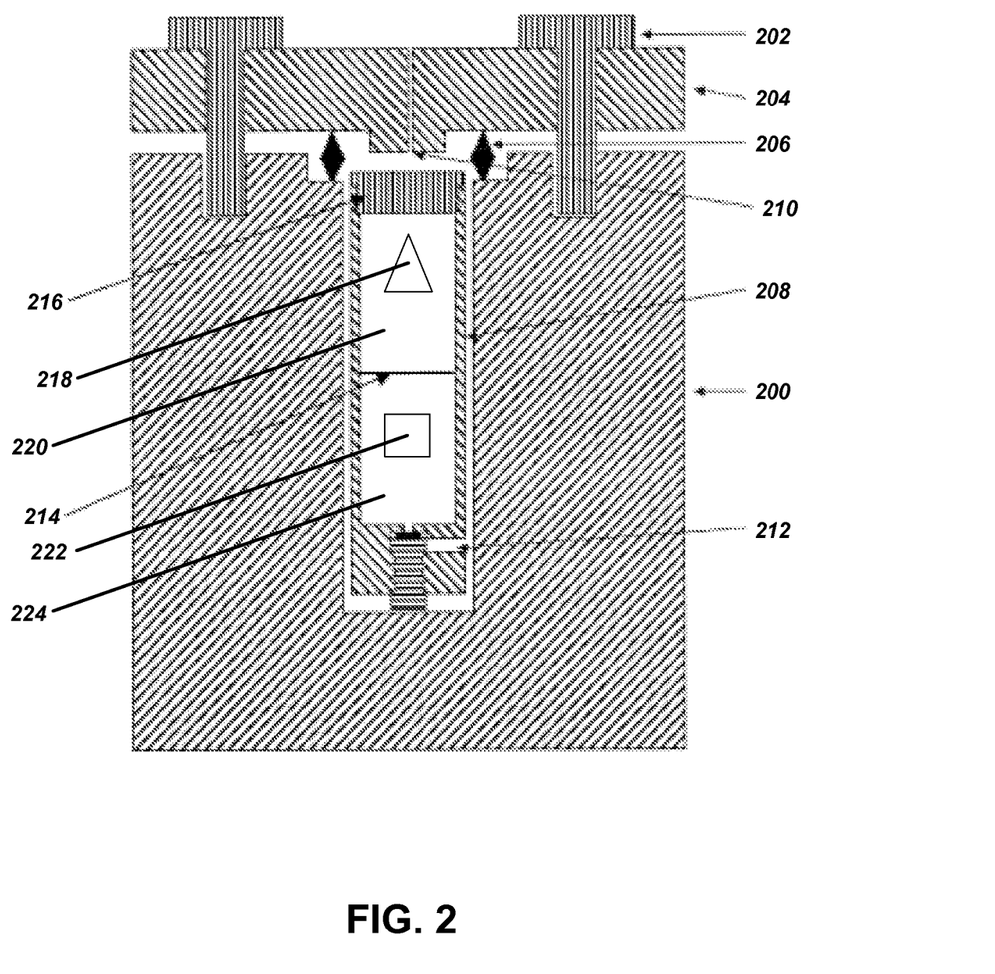
FIG. 2 is a schematic of an autoclave according to an embodiment of the present invention.

FIG. 2 is a schematic of an autoclave according to an embodiment of the present invention.

The autoclave (200) comprises an autoclave lid (202), autoclave screws (204), a gasket (206), an internal chamber (208), an ammonia releasing port (210), an ammonia inlet port (212), internal chamber baffle (214) and internal chamber lid (216).

As noted above, the objective of the present invention is to provide a method of growing large high-quality GaN crystals in supercritical ammonia with a fast growth rate. GaN bulk crystals are grown in supercritical ammonia by using Ga-containing source materials, typically Ga metal or polycrystalline GaN.

The autoclave (200), which has a long dimension along the vertical direction, is used to contain high-pressure ammonia at temperatures exceeding 300° C. Since the pressure of ammonia reaches more than 1.5 kbar, the wall thickness of the autoclave (200) must be at least 1 inch.

In order to grow large crystals, the inner diameter of the autoclave (200) is designed to be more than 5 cm. Due to high pressure and the large cross section of the autoclave (200), the necessary tightening torque of screws (204) to seal the lid (202) of the autoclave (200) is very high. To hold high-pressure at temperatures higher than 300° C., a Ni—Cr based superalloy is used as an autoclave (200) material. However, the Ni—Cr seizes the screws (204) of the lid (202) after heat cycling to grow GaN. After the autoclave (200) is cooled down, the necessary torque to loosen the screws (204) of the lid (202) easily exceeds the maximum torque of a hydraulic wrench.

Therefore, it is necessary to loosen the screws (204) of the lid (202) before cooling down the autoclave (200). In order to loosen the screws (204) of the lid (202) before cooling down, the high-pressure ammonia is released under heated condition after GaN growth. The autoclave (200) is equipped with an ammonia-releasing port (210) with a high-pressure valve. The location of the ammonia-releasing port (210) is at the top of the autoclave (200) because $H_2$ generated by growth reaction stays inside the tubing of the ammonia-releasing port (210), thereby preventing clogging of the port (210).

The internal chamber (208) is used to realize safe operation and pure crystal growth. Since the total volume of the autoclave (200) to grow large GaN crystals is very large, the necessary amount of anhydrous liquid ammonia is more than 100 g. Since the direct feeding of ammonia to the autoclave (200) through the ammonia-releasing port (210) takes a very long time due to the very small conductance of the high-pressure valve, it is necessary to use an internal chamber (208) equipped with an ammonia-inlet port (212) whose conductance is larger than that of the ammonia-releasing port (210). In this way, Ga-containing materials used as source materials, GaN single crystals used as seed crystals, mineralizers, and ammonia can be loaded outside of the massive autoclave (200).

The internal chamber (208) is equipped with a baffle (214), which divides the internal chamber (208) into two regions along the longitudinal direction of the autoclave (200), wherein these regions are designated as a top region and a bottom region. The Ga-containing materials are typically loaded in the top region and the GaN single crystals are typically placed in the bottom region. Mineralizers containing alkali metal or alkali earth metal are also loaded into the internal chamber (208). Moreover, In-containing material, typically In metal, is preferably added to increase growth rate of GaN. After loading all solid materials in the internal chamber (208), the lid (216) of the internal chamber (208) is sealed. Ammonia is fed through the ammonia-inlet port (212) of the internal chamber (208). After the ammonia charge, the ammonia-inlet port (212) is closed with a gas-tight screw. In this way, all solid materials and ammonia can be loaded into the internal chamber (208) without any oxygen and moisture contamination.

Existing technology typically uses $KNH_2$, $NaNH_2$, $LiNH_2$, K, Na, Li as mineralizers. Instead of the mineralizers containing Group I alkali metals, use of Group II alkali earth compounds such as $Ca(NH_2)_2$, $Mg(NH_2)_2$, $Ba(NH_2)_2$, $Ca_3N_2$, $Mg_3N_2$, $MgCl_2$, $CaCl_2$, $MgBr_2$, $CaBr_2$, $MgI_2$, or $CaI_2$ is preferable because contamination of group I alkali metal results in colored GaN crystals. In-containing materials such as In metal can be added to increase the growth rate of GaN.

After charging all necessary materials in the internal chamber (208), the internal chamber (208) is transported into the autoclave (200). The internal chamber (208) is designed to release ammonia under heated conditions and the high-pressure ammonia is contained by the autoclave (200). The autoclave (200) is heated with multi-zone heaters to set a temperature difference between the top region and the bottom region. In this way, the source materials are dissolved in the supercritical ammonia, transported to the seed crystals, and GaN is crystallized on the seed crystals.

Existing technology uses Ni—Cr superalloy for the internal chamber materials. However, Ni—Cr superalloy causes contamination of the grown GaN. Based on corrosion-resistance experiments on various metals, Vanadium and Vanadium based alloys are suitable materials for the internal chamber (208) or a liner coating of the internal chamber (208).

The internal chamber is equipped with baffles (214) which divides the internal chamber (208) into two regions along the longitudinal direction of the autoclave, wherein the two regions are known as a top region and a bottom region. Since the large sized high-pressure vessel has a thick wall to hold high-pressure, it is challenging to set enough temperature difference between the two regions with one baffle plate. Therefore, using more than one baffle plate is preferable.

The Ga-containing source materials (218) such as Ga metal or polycrystalline GaN are placed in the top region (218) of the internal chamber and seed crystals (220) such as single crystal GaN are placed in the bottom region (222) of the internal chamber (208).

To enhance the reaction, a small amount of chemicals called mineralizers are added. Existing technology typically uses $KNH_2$, $NaNH_2$, $LiNH_2$, K, Na, Li to obtain a basic condition. Instead of the mineralizers containing Group I alkali metals, use of Group II alkali earth compounds such as $Ca(NH_2)_2$, $Mg(NH_2)_2$, $Ba(NH_2)_2$, $Ca_3N_2$, $Mg_2N_2$, $MgCl_2$, $CaCl_2$, $MgBr_2$, $CaBr_2$, $MgI_2$, $CaI_2$, prevents contamination of the grown GaN crystals with alkali metals. In addition, in this invention, indium (In) containing materials such as In metal is added to increase the GaN growth rate.

The internal chamber (208) is filled with ammonia, loaded into the autoclave (200), and the autoclave (200) is heated from outside by multi-zone heaters to a set temperature difference between the top region (220) and the bottom region (224).

The use of the autoclave (200) and proper heating and materials (218, 222) being added to the autoclave (200) in accordance with the present invention allow for direct growth of GaN with an exposed N-face or M-plane that is of device quality. This allows for direct processing of GaN devices rather than performing debonding and/or cleaving of the grown GaN to expose the N-face or M-plane, or processing of a rough N-face or M-plane prior to device layer growth. This reduction in processing steps reduces the overall cost of GaN devices, as well as reducing the time to produce such devices and increasing the yield of such devices.

Process Flow

Figure 3:
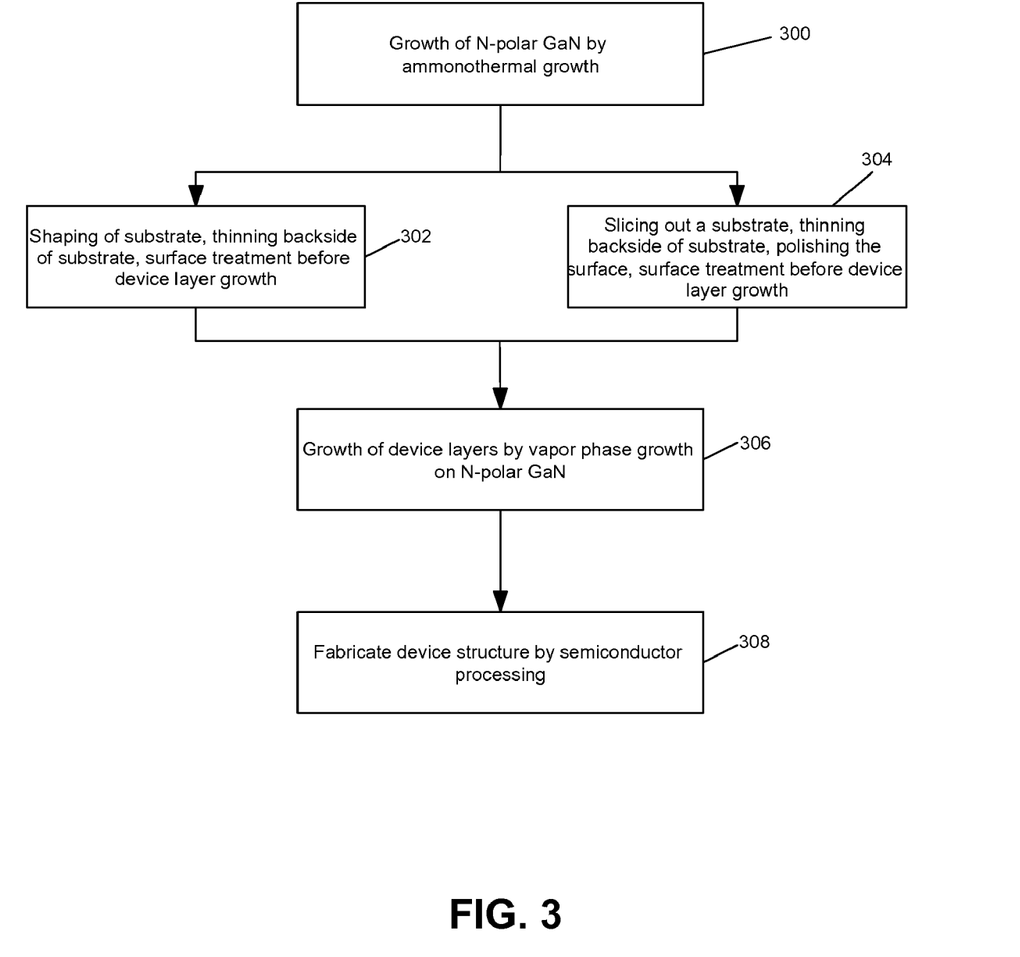
FIG. 3 illustrates a process flow diagram.

FIG. 3 shows a process flow diagram.

The objective of the present invention is to provide high-performance opto-electronic and electronic devices by utilizing a smooth surface of N-polar (N-face) GaN or M-plane GaN as a substrate. Box 300 illustrates growing a smooth N-polar (N-face) GaN or M-plane GaN substrate by ammonothermal growth as described herein. The ammonothermal growth illustrated in box 300 can be used for either growing a N-polar (N-face) or M-plane film of GaN or growing bulk GaN. In the case of film growth, box 302 illustrates shaping the substrate and back-etching so that it fits into the VPE reactor. Further, box 302 illustrates that before growing device layers, the N-polar (N-face) or M-plane surface grown in box 300 is cleaned with solvents, and, if necessary, surface polishing, angled-polishing of the surface, or surface etching can be performed.

In the case of bulk growth, box 304 illustrates slicing GaN substrates from the bulk crystals grown in box 300, and further illustrates subsequent appropriate surface polishing and treatment. Then, box 306 illustrates growing device layers on the N-polar (N-face) or M-plane surface by conventional vapor phase epitaxy such as MOCVD or MBE. The exposed N-face or M-plane can be exactly within the c-plane 114, or the surface of the GaN can be slightly out-of-plane, with an off-axis angle of up to and including 25 degrees, but typically less than 10 degrees off-axis. Finally, box 308 illustrates fabricating a device structure using semiconductor processing.

So, the present invention allows for a group-III nitride layer to be grown on a substrate, wherein the group III nitride layer comprises an N-face of a C-plane (000-1) or M-plane {10-10} that is directly exposed as a result of the growth of the group-III nitride layer. Directly exposing the N-face or M-plane typically means that the N-face or M-plane is exposed as a result of the ammonothermal growth process, rather than the use of laser lift-off, cutting, or de-bonding techniques that separate the N-face or M-plane from the substrate. Further, the present invention contemplates that the N-face or M-plane will be substantially co-planar with the plane of the substrate, rather than substantially perpendicular as in sidewall lateral-epitaxial overgrowth (SLEO) or lateral-epitaxial overgrowth (LEO) techniques described elsewhere in the related art. However, if the seed crystals are slightly miss cut, then the N-face or M-plane will be slightly mis-aligned with the plane of the substrate, as much as 25 degrees as described above.

The group-III nitride layer having the N-face of the C-plane (000-1) or M-plane {10-10} grown in accordance with the present invention directly accepts growth of at least one additional group-III nitride layer. Directly accepts growth typically means that the group-III nitride layer grown in accordance with the present invention can be used to grow additional layers, e.g., InGaN layers, additional GaN layers, etc., without further processing to smooth out the layer. No dry etching, wet etching, or polishing is typically needed to prepare the N-face of the C-plane (000-1) or M-plane {10-10} when the present invention's methods and devices are used.

Although described with respect to ammononthermal growth herein, other growth techniques can be used in conjunction with or in place of the ammonothermal growth technique herein described without departing from the scope of the present invention.

Device Examples

Figure 4:
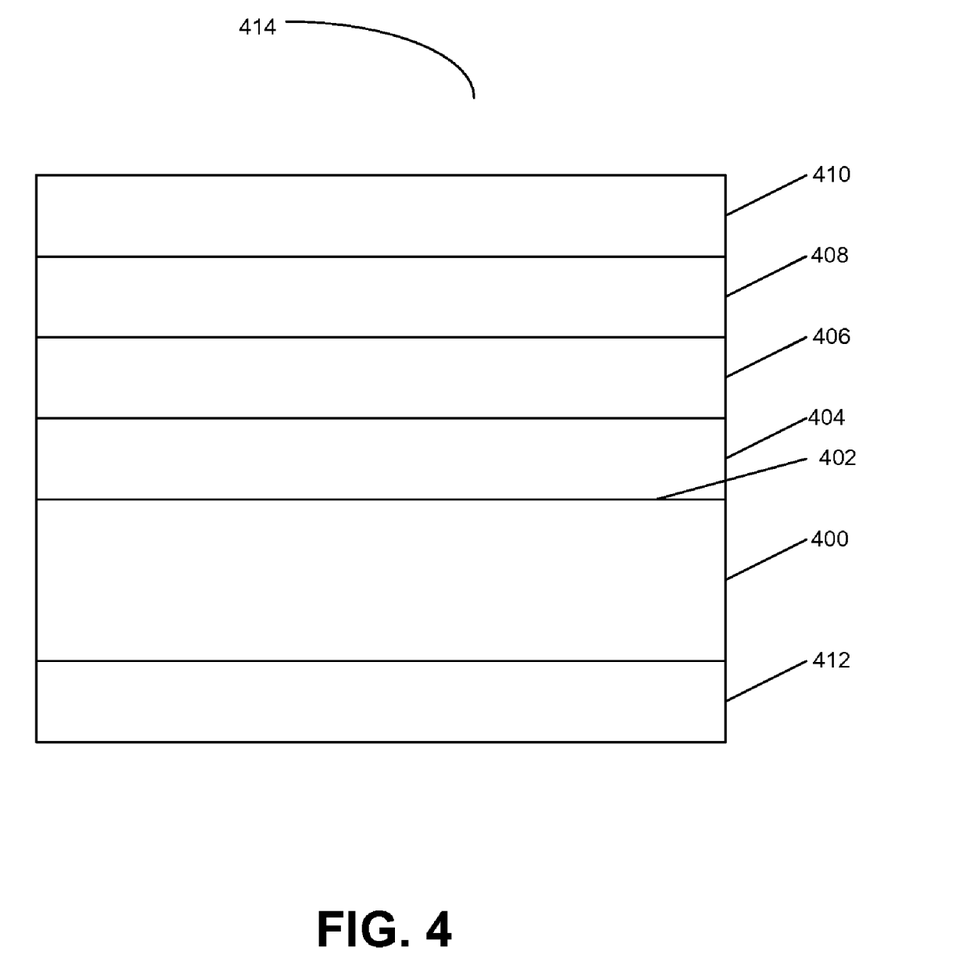
FIG. 4 illustrates an example of a LED using a high-doped Mg layer on a N-polar (N-face) substrate.

FIG. 4 illustrates an example of a LED using a high-doped Mg layer on a N-polar (N-face) or M-plane substrate. By using the N-polar (N-face) or M-plane surface, the doping level of Mg is not limited by formation of inversion domains. This structure has a lower series resistance which leads to higher emission efficiency.

Substrate 400 is shown, and is grown using the ammonothermal method disclosed herein. Substrate 400 is grown with the N-polar (N-face) or M-plane surface 402 as a surface for future growth steps. N-type GaN layer 404 is then grown on the N-polar (N-face) or M-plane surface 402, using VPE or other growth techniques. Active layer 406 is then grown on N-type layer 404, where active layer 406 is a light-emitting layer of material. Highly doped layer 408 is then grown on active layer 406. Highly doped layer 408 is typically a highly-doped p-type GaN layer, doped with Mg and thicker than 0.1 micron, where the Mg doping level is typically above $10^{20}$ $cm^{-3}$ and sometimes above $10^{21}$ $cm^{-3}$. Anode 410 and cathode 412 act as the electrode contacts for device 414, which is a LED.

Figure 5:
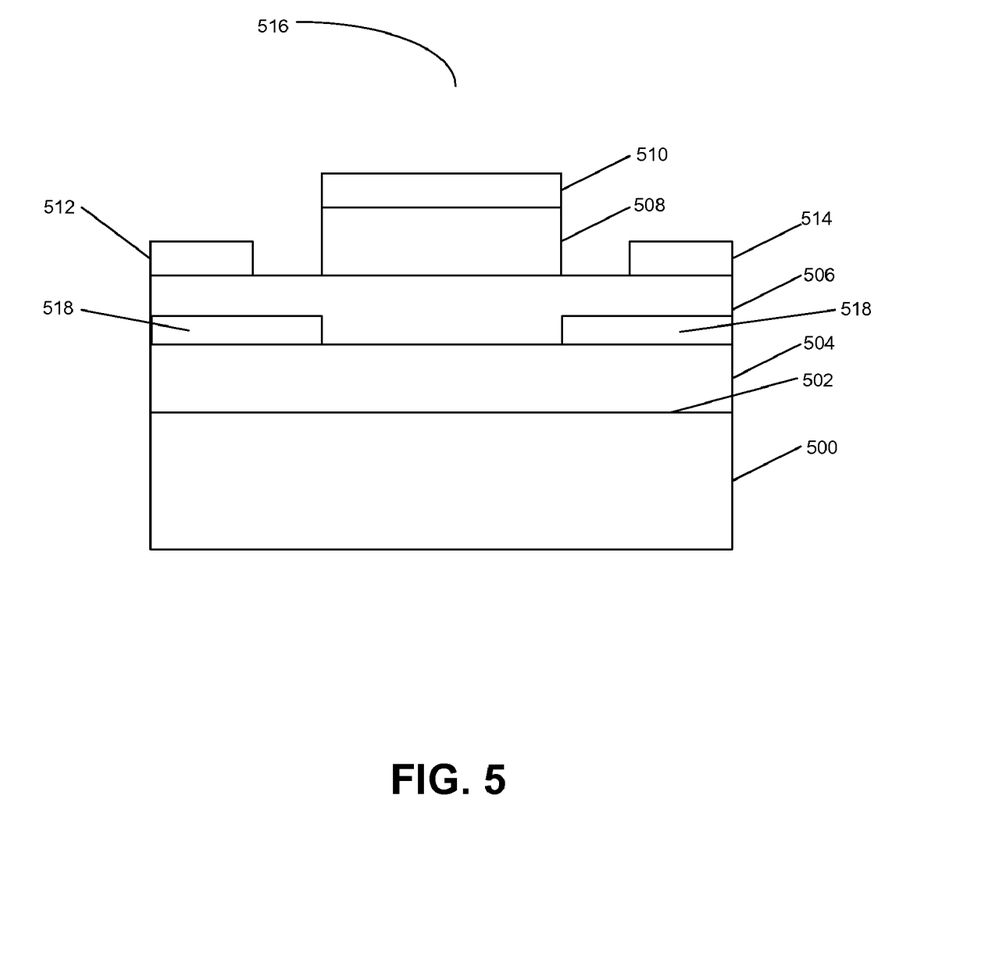
FIG. 5 illustrates a HEMT utilizing N-polar (N-face) smooth surface of GaN grown by the ammonothermal method.

FIG. 5 illustrates a HEMT utilizing N-polar (N-face) smooth surface of GaN grown by the ammonothermal method. As in FIG. 2, substrate 500 is shown, and is grown using the ammonothermal method disclosed herein. Substrate 500 is grown with the N-polar (N-face) surface 502 as a surface for future growth steps. Undoped AlGaN layer 504 is then grown on the N-polar (N-face) surface 502, using VPE or other growth techniques. Undoped GaN layer 506 is then grown on undoped AlGaN layer 504, where layer 506 acts as the charge carrying layer for the HEMT. Undoped AlGaN gate layer 508 is then grown on layer 506. Gate electrode 510, source electrode 512 and drain electrode 514 act as the electrode contacts for device 516, which is a HEMT.

Unlike the conventional HEMT structure using Ga-polar (Ga-face) GaN, the electron sheet charge 518 is induced above AlGaN layer 504, not below AlGaN layer 504, so that the induced carriers cannot leak out to the substrate 500. Also, the AlGaN layer 508 below the gate electrode 510 modifies the internal electric field to sweep away the electrons under the gate while maintaining electrons under the source 512 and drain 514 regions. This enables enhancement-mode HEMT (normally-off mode) devices 516 which have not been attained with GaN/AlGaN systems grown on a Ga-polar (Ga-face) surface.

EXPERIMENTAL RESULTS

Example 1

Growth of Smooth N-Polar (N-Face) GaN Using Metallic Ga in Ammonothermal Method

Figure 6:
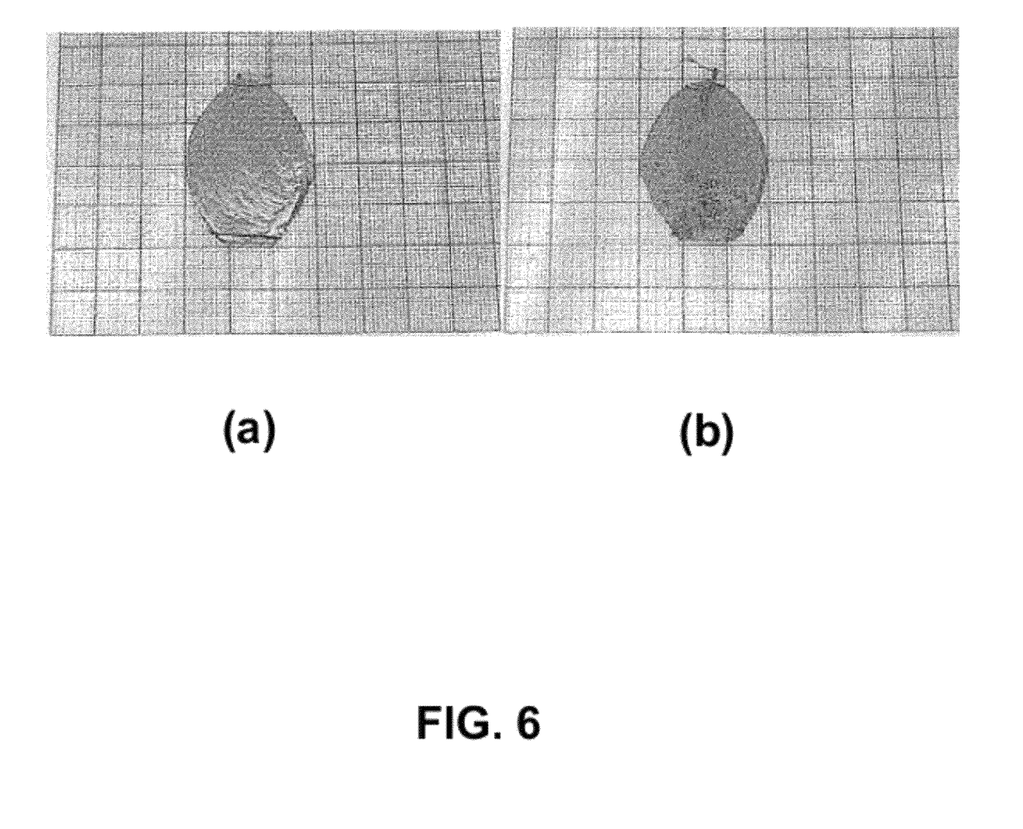
FIGS. 6(a) and 6(b) illustrate GaN crystals grown in a first method in accordance with the present invention.

A large surface area, about 3 cm×4 cm, of a GaN seed crystal, a small surface area about 5 mm×5 mm, of some GaN seed crystals, 40 g of Ga metal, $NaNH_2$ (1 mol % to ammonia), NaI (0.05 mol % to ammonia), 1.0 g of In metal, and 114.3 g of anhydrous liquid ammonia were loaded into the internal chamber. After transporting the internal chamber 208 into the autoclave 200 of which the inner diameter is about 5 cm, the autoclave 200 was heated at 625° C. (top region 220) and 675° C. (bottom region 224). The resulting maximum pressure was 31505 psi (2.2 kbar). The autoclave 200 was maintained at this high temperature for 1 day and the ammonia was released after 1 day. The resulting GaN crystal grown in the autoclave 200 according to the method of the present invention is shown in FIGS. 6(*a*) and 6(*b*). FIG. 6(*a*) shows the N-polar (N-face) surface and FIG. 6(*b*) shows the Ga-polar (Ga-face) surface. The thickness of the ammonothermally grown layer (layers 400 and/or 500 discussed in FIGS. 4 and 5) was about 40 microns. As shows in FIGS. 6(*a*)-(*b*), the N-face is smoother than Ga-face. This smooth surface is suitable for successive device fabrication by vapor phase growth.

The N-face shown in FIG. 6(*a*) is ready for device layer growth described in FIGS. 4-5 without subsequent processing; as such, GaN wafers produced by the method of the present invention do not need to be de-bonded or have substrates removed to expose the N-face of the c-plane for device production.

Example 2

Figure 7:
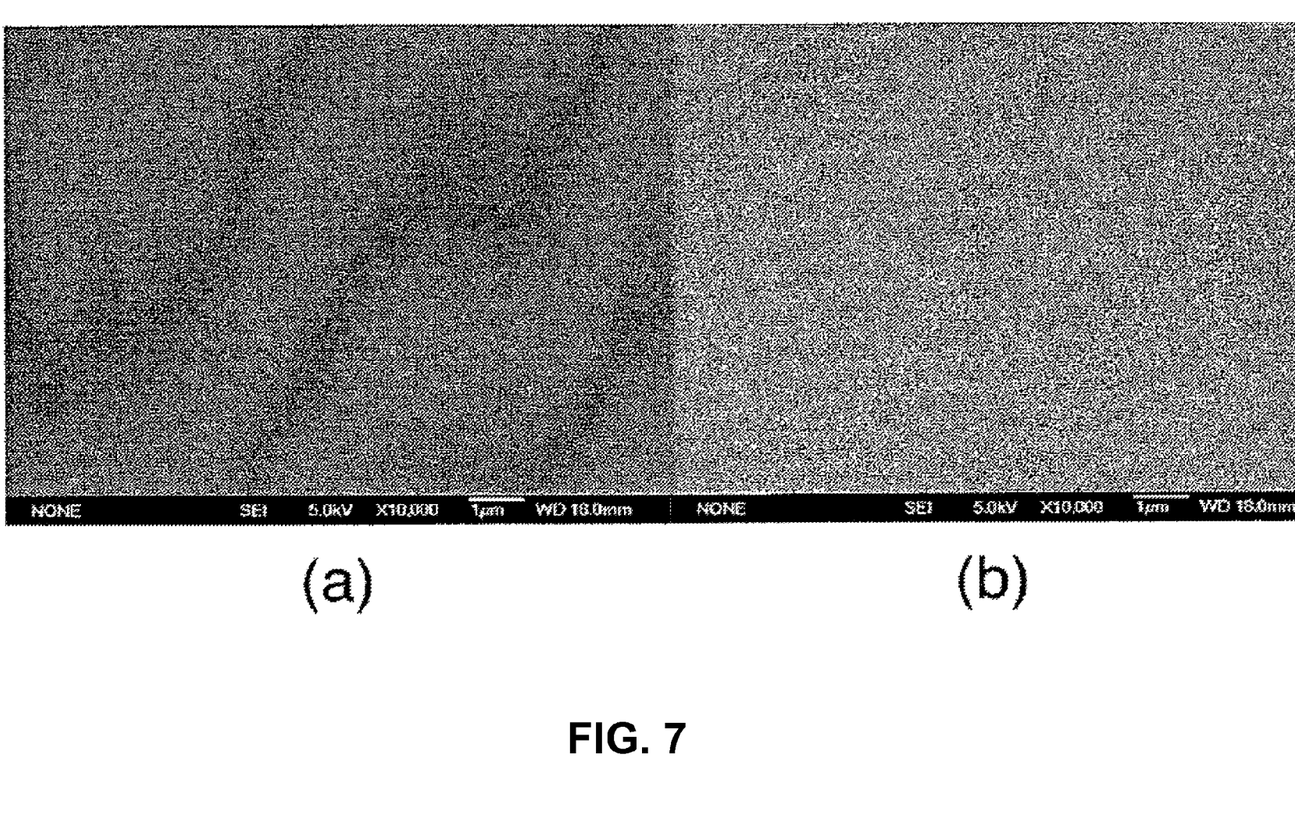
FIGS. 7(a) and 7(b) illustrate GaN crystals grown in a second method in accordance with the present invention.
FIG. 7C shows a photograph of the grown M-plane GaN.

Growth of Smooth N-Polar (N-Face) GaN Using Polycrystalline GaN in Ammonothermal Method GaN seed crystals in size of about 5 mm×5 mm, about 120 g of polycrystalline GaN, NaNH$_2$(3 mol % to ammonia), and 101.3 g of anhydrous liquid ammonia were loaded into the internal chamber. After transporting the internal chamber 208 into the autoclave 200 of which the inner diameter is about 5 cm, the autoclave 200 was heated at 550° C. (top region 220) and 675° C. (bottom region 224). The resulting maximum pressure was 27686 psi (1.9 kbar). The autoclave 200 was maintained at this high temperature for 10 days and the ammonia was released after 10 days. About 2.5-2.6 microns of GaN films were grown on a seed crystal. Scanning electron microscope images of the resulting GaN crystal are shown in FIGS. 7(*a*) and 7(*b*). FIG. 7(*a*) shows the N-face and FIG. 7(*b*) shows the Ga-face. Similar to Example 1, the N-polar (N-face) surface was smoother than the Ga-polar (Ga-face). The N-face shown in FIG. 7(*a*) is smooth enough for direct growth of device layers as described in FIGS. 4-5.

Example 3

Growth of Smooth M-Plane GaN Using Polycrystalline GaN in Ammonothermal Method

Figure 7C:
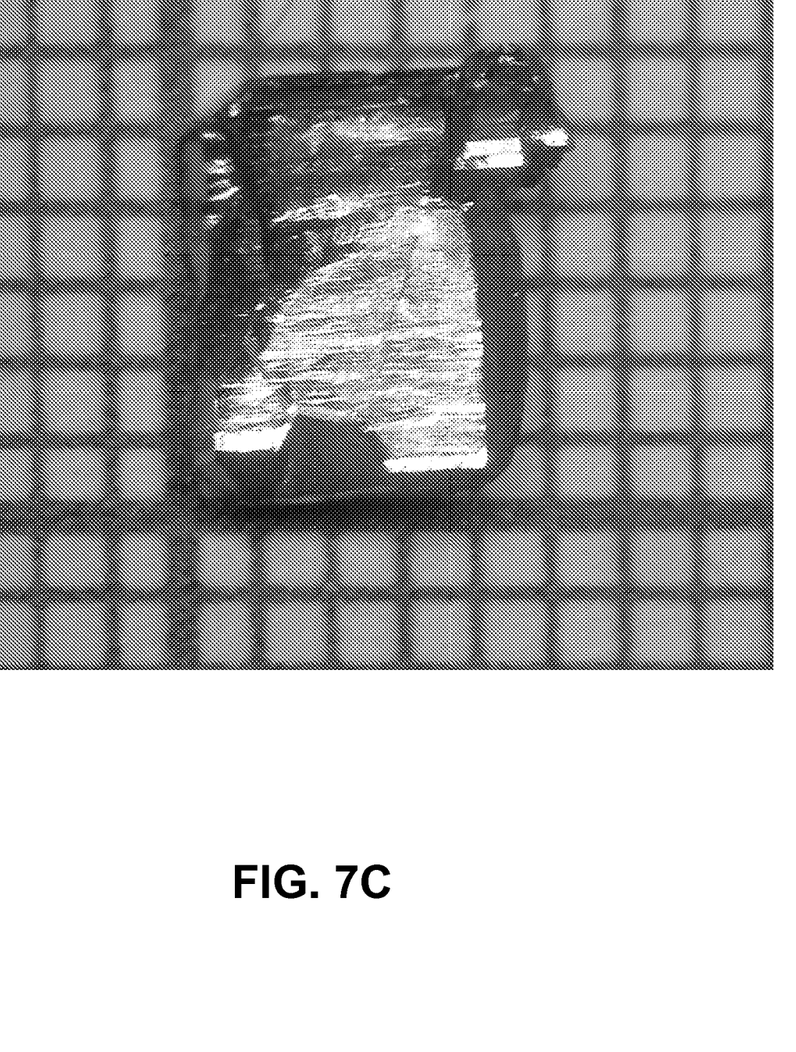

M-plane GaN seed crystals in size of about 3 mm×3 mm, about 100 g of polycrystalline GaN, NaNH$_2$(3.8 mol % to ammonia), and 101.5 g of anhydrous liquid ammonia were loaded into the internal chamber. After transporting the internal chamber 208 into the autoclave 200 of which the inner diameter is about 5 cm, the autoclave 200 was heated at 510° C. (top region 220) and 700° C. (bottom region 224). The resulting maximum pressure was 27986 psi (1.9 kbar). The autoclave 200 was maintained at this high temperature for 83 days and the ammonia was released after 83 days. Smooth M-plane GaN was grown on the M-plane GaN seed. FIG. 7C shows a photograph of the grown M-plane GaN.

Example 4

Figure 8:
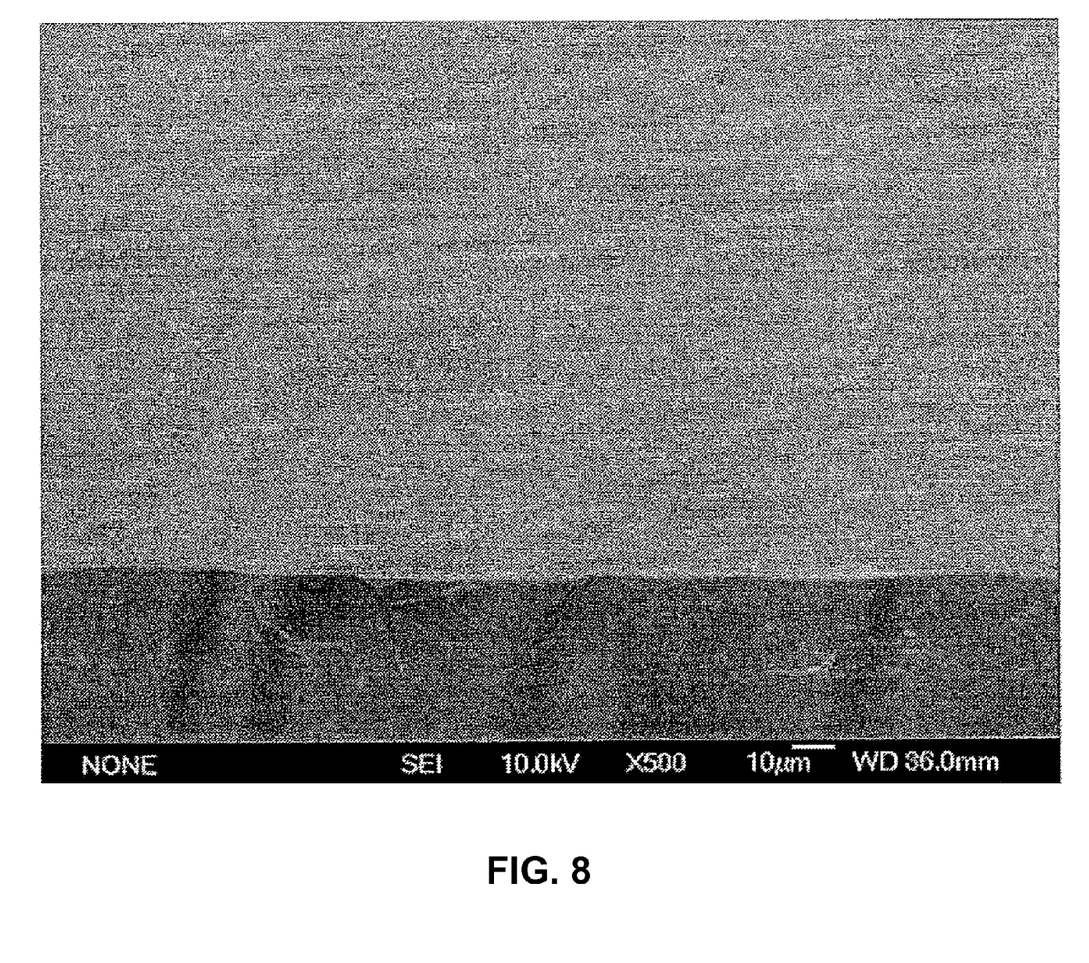
FIG. 8 illustrates a 1 micron-thick GaN layer with a smooth surface grown on the GaN crystals of FIG. 4(a)

Growth of Smooth N-Polar (N-Face) GaN by MOCVD on N-Polar (N-Face) GaN Prepared by the Ammonothermal Method A GaN thin film was grown by MOCVD on N-face GaN grown in Example 1. Prior to the growth, the backside (Ga-face) of the substrate was thinned with a grinding machine down to about 400 microns. A GaN thin film was grown with trimethylgallium and ammonia as source gases under low pressure. The flow rate of trimethylgallium and ammonia was 18 μmol/min and 3 liter/min, respectively. The substrate temperature was 1185° C. and the reactor pressure was 76 Torr. Typically, the growth pressure is below 760 Torr, and is typically approximately 100 Torr. After 1 hour of growth, about a 1 micron-thick GaN layer with a smooth surface of the N-face of the C-plane directly exposed was obtained, as shown in FIG. 8.

Possible Modifications and Variations on the Preferred Embodiment

Although GaN films growth by ammonothermal method were presented in the examples, GaN substrates sliced from bulk GaN crystals grown by ammonothermal method can also be used for high-performance optoelectronic and electron devices. Mineralizers used in the examples were NaNH$_2$, but other mineralizers such as KNH$_2$, LiNH$_2$, NH$_4$Cl, NH$_4$Br, NH$_4$I, and others can be used to grow smooth N-polar (N-face) GaN.

In the experimental results and examples, only N-face of the C-plane GaN or M-plane GaN was explained. However, similar effect can be expected for {11-20} A-plane GaN, {10-11}, {10-1-1}, {11-22}, or {11-2-2} semipolar planes.

Advantages

In existing methods and devices, the Ga-polar (Ga-face) surface is used for device fabrication. The use of the Ga-polar (Ga-face) surface has disadvantages in its nature, which limits the performance of resulting opto-electronic and electronic devices. However, despite predicted benefits of N-polar (N-face) or M-plane devices, existing growth methods cannot provide a smooth N-polar (N-face) or M-plane surface for subsequent growth and device processing.

In the current invention, it is presented that ammonothermal growth method provides a smooth N-polar (N-face) or M-plane surface which is suitable for successive device fabrication. All kinds of opto-electronic and electronic devices can improve the performance by using the N-polar (N-face) or M-plane surface prepared with the ammonothermal method of the present invention. The present invention also reduces processing steps because flip-chip bonding and de-bonding steps are no longer needed to expose the N-face or M-plane of the growth.

Process Chart

Figure 9:
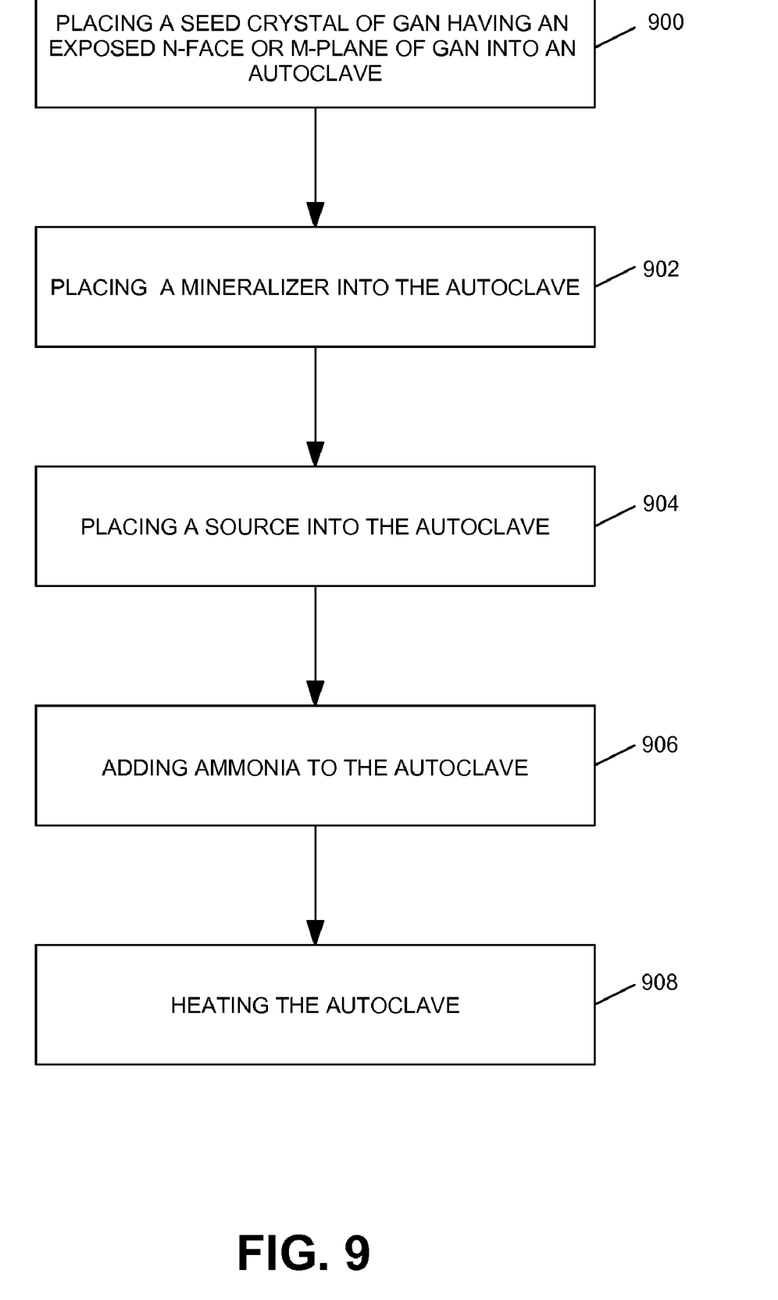
FIG. 9 illustrates a process chart outlining the steps used to perform the invention.

FIG. 9 illustrates a process chart outlining the steps used to perform the invention.

Box 900 illustrates placing a seed crystal of GaN having an exposed N-face or M-plane of GaN into an autoclave.

Box 902 illustrates placing a mineralizer into the autoclave.

Box 904 illustrates placing a source into the autoclave.

Box 906 illustrates adding ammonia to the autoclave.

Box 908 illustrates heating the autoclave.

CONCLUSION

In summary, the present invention describes methods and devices which have a directly grown N-face of the C-plane (000-1) or M-plane {10-10}. Although described with respect to GaN herein, any group-III nitride material can benefit from the teachings of the present invention.

An electronic device in accordance with the present invention comprises a GaN layer, wherein the GaN layer is fabricated by utilizing an N-polar (000-1) surface of the GaN layer having an off-axis angle less than 10 degrees, wherein the N-polar (000-1) surface is prepared with an ammonothermal growth technique.

Such a device further optionally comprises the GaN being fabricated under pressure less than 760 Torr, and an AlGaN layer coupled to the N-polar surface of the GaN layer, and a second GaN layer coupled to the AlGaN layer, wherein electrons are induced at the interface between the AlGaN layer and the second GaN layer on the second GaN layer side.

An opto-electronic device in accordance with the present invention comprises an electrically conducting GaN substrate having an N-polar or M-plane surface whose off-axis angle is less than ten degrees, the GaN substrate being fabricated using an ammonothermal growth method, a plurality of n-type group III nitride layers coupled to the N-polar or M-plane surface of the GaN substrate, at least one group III nitride light-emitting active layer coupled to the plurality of n-type group III nitride layers, and at least one p-type group III nitride layer having an Mg doping coupled to the active layers.

Such a device further optionally comprises at least one Mg-doped layer, wherein a concentration of the Mg-doped layer is more than $10^{21}$ cm$^{-3}$, and a thickness of the Mg-doped layer is more than 0.1 micron.

A method for directly growing N-polar (000-1) or M-plane Gallium Nitride (GaN) in accordance with the present invention comprises placing a seed crystal of GaN having an exposed N-face (000-1) or M-plane of GaN into an autoclave, placing a mineralizer into the autoclave, placing a source into the autoclave, adding ammonia to the autoclave, and heating the autoclave.

Such a method further optionally comprises the mineralizer being selected from a group comprising NaNH$_2$, KNH$_2$, LiNH$_2$, NH$_4$Cl, NH$_4$Br, and NH$_4$I, the source comprising Ga metal, the autoclave being heated in zones, a first zone being heated to a first temperature and a second zone being heated to a second temperature, and the source being placed in the first zone and the seed crystal of GaN having an exposed N-face (000-1) or M-plane of GaN being placed in the second zone.

A group-III nitride layer in accordance with the present invention comprises a group-III nitride layer grown on a substrate, wherein the group-III nitride layer comprises an N-face of a C-plane (000-1) or M-plane {10-10} that is directly exposed as a result of the growth of the group-III nitride layer.

Such a layer further optionally comprises the growth being an ammonothermal growth, the N-face of the C-plane (000-1) or M-plane {10-10} is substantially co-planar with a surface of the substrate, the N-face of the C-plane (000-1) or M-plane {10-10} is tilted with respect to a surface of the substrate, the N-face of the C-plane (000-1) or M-plane {10-10} is tilted at an angle less than 10 degrees with respect to the surface of the substrate, the N-face of the C-plane (000-1) or M-plane {10-10} directly accepts growth of at least one additional group-III nitride layer, the at least one additional group-III nitride layer comprising at least one Mg-doped layer wherein a concentration of the Mg-doped layer is more than $10^{21}$ cm$^{-3}$, and a thickness of the Mg-doped layer being more than 0.1 micron.

Although described with respect to the N-face of the C-plane and the M-plane of the GaN crystal, the present invention works with any surface of the GaN crystal that is not Ga-polar. In other words, the present invention works with every surface of the GaN wurtzite structure other than the Ga-face of the C-plane, which is Ga-polar. All other non-Ga polar surfaces, especially those outside of the C-plane, benefit from the present invention. Such surfaces include at least the M-plane {10-10} surface, the A-plane {11-20} surface, a {10-11} surface, a {10-1-1} surface, a {11-22} surface, and a {11-2-2} surface.

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the full range of equivalents to the claims appended hereto.

What is claimed is:

1. A method for directly growing a non-Ga-polar surface of gallium nitride (GaN), comprising:
    placing a seed crystal of GaN having an exposed non-Ga-polar surface of GaN into an autoclave;
    placing a mineralizer into the autoclave;
    placing a source into the autoclave;
    adding ammonia to the autoclave;
    heating the autoclave; and
    ammonothermally growing the GaN in the heated autoclave, using the mineralizer, source and ammonia, wherein the exposed non-Ga-polar surface of the GaN is smoother than a Ga-polar surface of the GaN.

2. The method of claim 1, wherein the mineralizer is selected from a group comprising NaNH$_2$, KNH$_2$, LiNH$_2$, NH$_4$Cl, NH$_4$Br, and NH$_4$I.

3. The method of claim 1, wherein the source comprises polycrystalline GaN.

4. The method of claim 1, wherein the autoclave is heated in zones.

5. The method of claim 4, wherein a first zone is heated to a first temperature and a second zone is heated to a second temperature.

6. The method of claim 5, wherein the source is placed in the first zone and the seed crystal of GaN having the exposed non-Ga polar surface of GaN is placed in the second zone.

7. The method of claim 6, wherein the non-Ga polar surface is an N-polar C-plane (000-1) surface.

8. The method of claim 6, wherein the non-Ga polar surface is an M-plane {10-10} surface.

9. The method of claim 6, wherein the non-Ga polar surface is an A-plane {11-20} surface.

10. The method of claim 6, wherein the non-Ga polar surface is a {10-11} surface.

11. The method of claim 6, wherein the non-Ga polar surface is a {10-1-1} surface.

12. The method of claim 6, wherein the non-Ga polar surface is a {11-22} surface.

13. The method of claim 6, wherein the non-Ga polar surface is a {11-2-2} surface.

14. The method of claim 1, wherein the source comprises Ga metal.

15. A method of fabricating a gallium nitride (GaN) substrate, comprising:
    ammonothermally growing a GaN substrate resulting in an exposed N-polar (N-face) or M-plane surface that is smoother than a Ga-polar (Ga-face) surface of the GaN substrate.

16. The method of claim 15, wherein the N-polar (N-face) or M-plane surface is smooth enough for growth of device layers.

17. The method of claim 16, wherein the N-polar (N-face) or M-plane surface is smooth enough for direct growth of device layers.

18. The method of claim 17, wherein the N-polar (N-face) or M-plane surface is smooth enough for direct growth of device layers without subsequent processing.

19. A method of fabricating an opto-electronic device comprising:
    fabricating a GaN substrate from a GaN bulk crystal grown ammonothermally on a GaN seed, wherein a growth surface of the GaN bulk crystal is not a Ga-polar surface and the growth surface as grown is smoother than a Ga-polar surface; and
    growing one or more group III nitride layers on the growth surface of the GaN substrate.

20. The method of claim 19, wherein the growing step comprises:
    growing a plurality of n-type group III nitride layers on the growth surface;
    growing at least one group III nitride light-emitting active layer on the plurality of n-type group III nitride layers; and
    growing at least one p-type group III nitride layer having an Mg doping on the active layers.

21. The method of claim 20, wherein an Mg concentration of the Mg-doped layer is more than $10^{21}$ cm$^{-3}$.

22. The method of claim 19, wherein the growth surface is an M-plane {10-10} surface.

23. The method of claim 19, wherein the growth surface is an A-plane {11-20} surface.

24. The method of claim 19, wherein the growth surface is a {10-11} surface.

25. The method of claim 19, wherein the growth surface is a {10-1-1} surface.

26. The method of claim 19, wherein the growth surface is a {11-22} surface.

27. The method of claim 19, wherein the growth surface is a {11-2-2} surface.

28. The method of claim 19, wherein the growth surface is a {20-21} surface.

29. A method for fabricating a GaN layer, comprising:
    utilizing an N-polar surface or an M-plane surface of the GaN layer as a growth surface, wherein the N-polar surface or the M-plane surface is prepared and directly exposed using an ammonothermal growth technique and the N-polar surface or the M-plane surface is smoother than a Ga-polar surface of the GaN layer.

30. The method of claim 29, further comprising growing one or more group-III nitride layers to the N-polar or M-plane surface of the GaN layer.

31. A method for growing a group-III nitride layer, comprising:
    ammonothermally growing a group-III nitride layer on a substrate, wherein the group-III nitride layer comprises an N-face of a C-plane (000-1) or a M-plane {10-10} that is directly exposed as a result of the growth of the group-III nitride layer and the N-face of the C-plane (000-1) or the M-plane {10-10} is smoother than a Ga-face of the C-plane (0001).

32. The method of claim 31, wherein the N-face of the C-plane (000-1) or the M-plane {10-10} is substantially co-planar with a surface of the substrate.

33. The method of claim 31, wherein the N-face of the C-plane (000-1) or the M-plane {10-10} is tilted with respect to a surface of the substrate.

34. The method of claim 31, wherein the N-face of the C-plane (000-1) or the M-plane {10-10} is tilted at an angle less than 10 degrees with respect to the surface of the substrate.

35. The method of claim 31, wherein the N-face of the C-plane (000-1) or the M-plane {10-10} directly accepts growth of at least one additional group-III nitride layer.

36. A method for fabricating a GaN substrate, comprising:
    directly growing a GaN substrate with an exposed N-face or M-plane surface that is of device quality using an ammonothermal growth method, wherein the exposed N-face or M-plane surface is smoother than a Ga-polar surface of the GaN substrate.

37. The method of claim 36, further comprising growing a group-III nitride layer on the substrate, wherein the group III nitride layer comprises an N-face of a C-plane (000-1) or M-plane {10-10} that is directly exposed as a result of the growth of the group-III nitride layer.

38. The method of claim 36, wherein the N-face or M-plane is substantially co-planar with the plane of the substrate, rather than substantially perpendicular.

39. The method of claim 36, wherein the N-face or M-plane is misaligned with the plane of the substrate.

40. The method of claim 36, wherein the group-III nitride layer directly accepts growth of at least one additional group-III nitride layer.

* * * * *